(12) United States Patent
Lu (10) Patent No.: US 6,906,599 B2
(45) Date of Patent: Jun. 14, 2005

(54) DESIGNING METHODS AND CIRCUITS FOR IMPEDANCE MATCHING

(75) Inventor: Shey-shi Lu, Taipei (TW)

(73) Assignees: Memetics Technology, Co., Ltd., Taipei (TW); National Taiwan University, Taipei (TW)

( * ) Notice: Subject to any disclaimer, the term of this patent is extended or adjusted under 35 U.S.C. 154(b) by 8 days.

(21) Appl. No.: 10/678,869

(22) Filed: Oct. 3, 2003

(65) Prior Publication Data

US 2004/0119556 A1 Jun. 24, 2004

(30) Foreign Application Priority Data

Dec. 19, 2002 (TW) .................................. 91136643 A (51) Int. Cl.[7] .................................................. H03H 7/38
(52) U.S. Cl. ..................... 333/32; 333/17.3; 330/302; 330/311
(58) Field of Search ................... 330/302, 310, 330/311; 333/32, 17.3

(56) References Cited

U.S. PATENT DOCUMENTS

| | | | | |
|---|---|---|---|---|
| 5,973,575 A | * | 10/1999 | Kamogawa et al. | 331/117 R |
| 6,130,589 A | * | 10/2000 | Yamaguchi et al. | 333/32 |
| 6,441,689 B1 | * | 8/2002 | Joseph | 330/302 |
| 6,603,351 B2 | * | 8/2003 | Suzuki | 330/133 |
| 6,628,176 B1 | * | 9/2003 | Okada | 333/32 |
| 6,653,905 B2 | * | 11/2003 | Ishibayashi | 330/302 |

* cited by examiner

Primary Examiner—Robert Pascal
Assistant Examiner—Kimberly Glenn
(74) Attorney, Agent, or Firm—Volpe and Koenig, P.C.

(57) ABSTRACT

The designing methods for an impedance matching are provided which include steps of: connecting in parallel a capacitor to a collector/drain of a bipolar/field effect transistor having a common-emitter configuration, and obtaining a desired resistance at a base/gate of the bipolar/field effect transistor due to a feedback effect for achieving the impedance matching. The circuits for an impedance matching are also provided which include: a first bipolar/field effect transistor, an inductor, a first resistor, a power supply, a capacitor, a second bipolar/field effect transistor, a second resistor, and a third resistor, wherein a desired resistance is produced in the input impedance looking into the base/gate of the first bipolar/field effect transistor through an equivalent parallel combination of an capacitor and an resistor produced at the base/gate of the second bipolar/field effect transistor so as to achieve the impedance matching.

8 Claims, 10 Drawing Sheets

DESIGNING METHODS AND CIRCUITS FOR IMPEDANCE MATCHING

FIELD OF THE INVENTION

The present invention relates to impedance matching, and more particularly to the designing methods and circuits for an impedance matching.

BACKGROUND OF THE INVENTION

Figure 1:
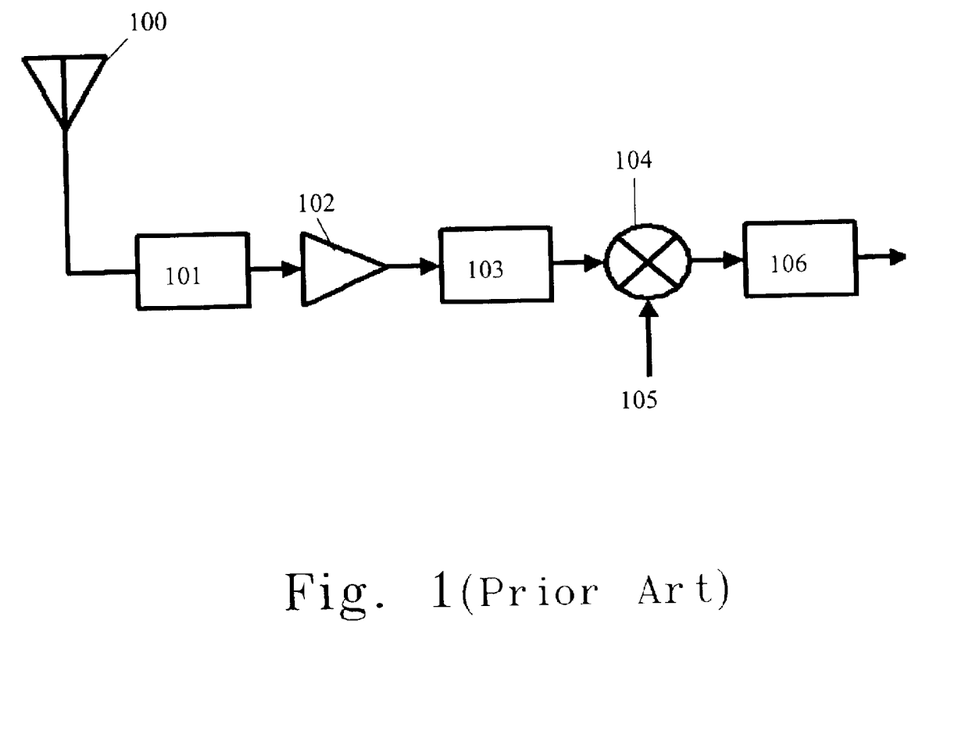
FIG. 1 is the block diagram of the super-heterodyne receiver of the prior art.

Impedance matching is often needed in the design of an electronic circuit. Please refer to FIG. 1. Using a superheterodyne receiver as an example, signals will be received by the antenna 100 firstly. These received signals will go through a bandpass filter 101 so as to filter out the signals outside the desired band secondly. Signals fall within the desired band will go into low-noise amplifier 102 to be amplified thirdly. Signals being amplified will go through an images rejection filter 103. The amplified radio frequency electrical signal will mix with a local oscillating signal 105 in the mixer 104 and be down converted to a lower intermediate frequency signal (IF signal). Finally, the intermediate frequency signal will be processed by an IF signal processing circuit 106. In order to match with the output impedance of the bandpass filter 101, the input impedance of the low-noise amplifier 102 is usually desired to be 50 ohm.

Figure 2A:
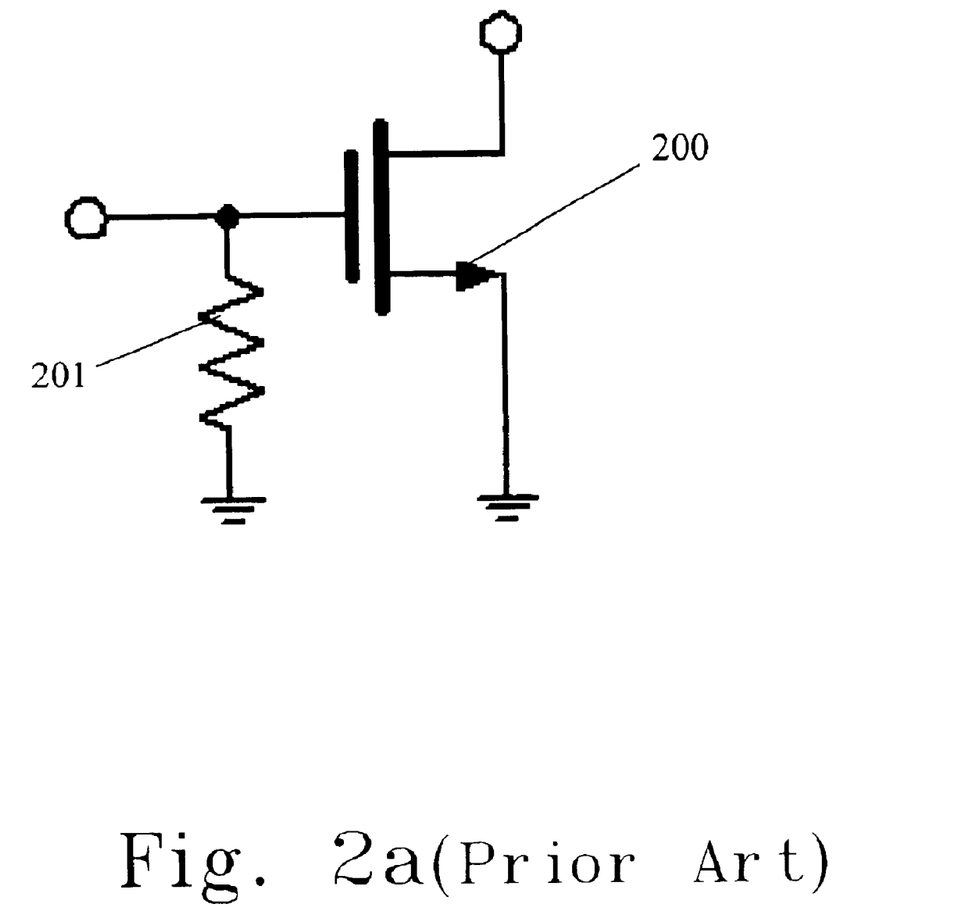
FIGS. 2(a) to 2(d) are the schematic circuit diagrams of the four methods for impedance matching proposed in the prior art respectively.
Figure 2B:
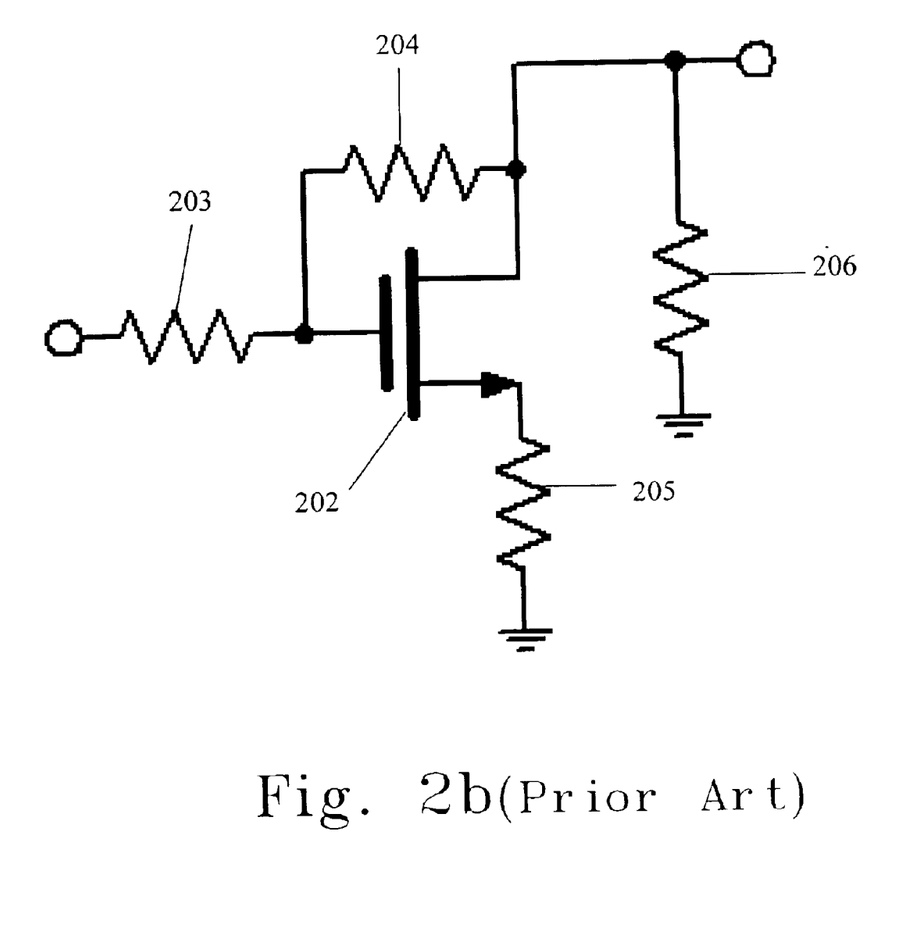
Figure 2C:
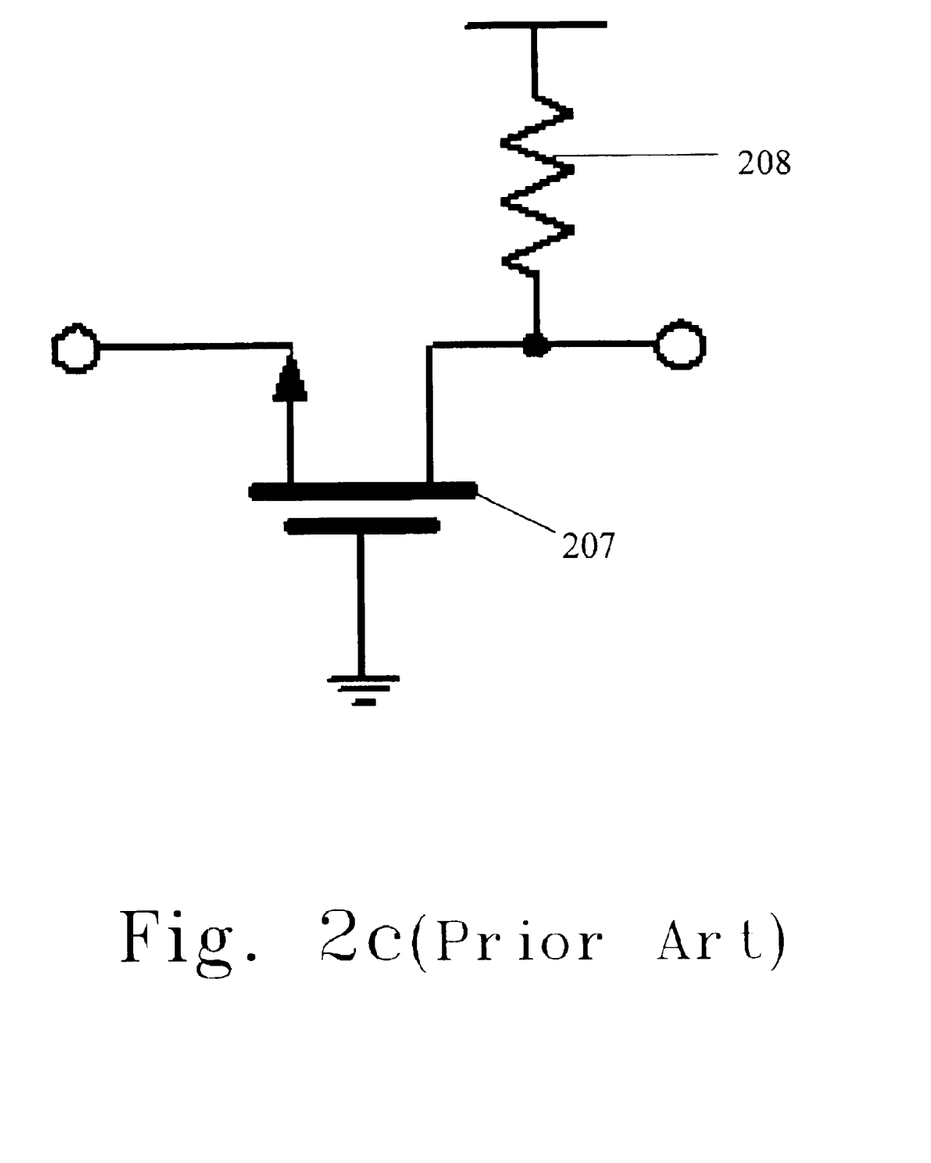
Figure 2D:
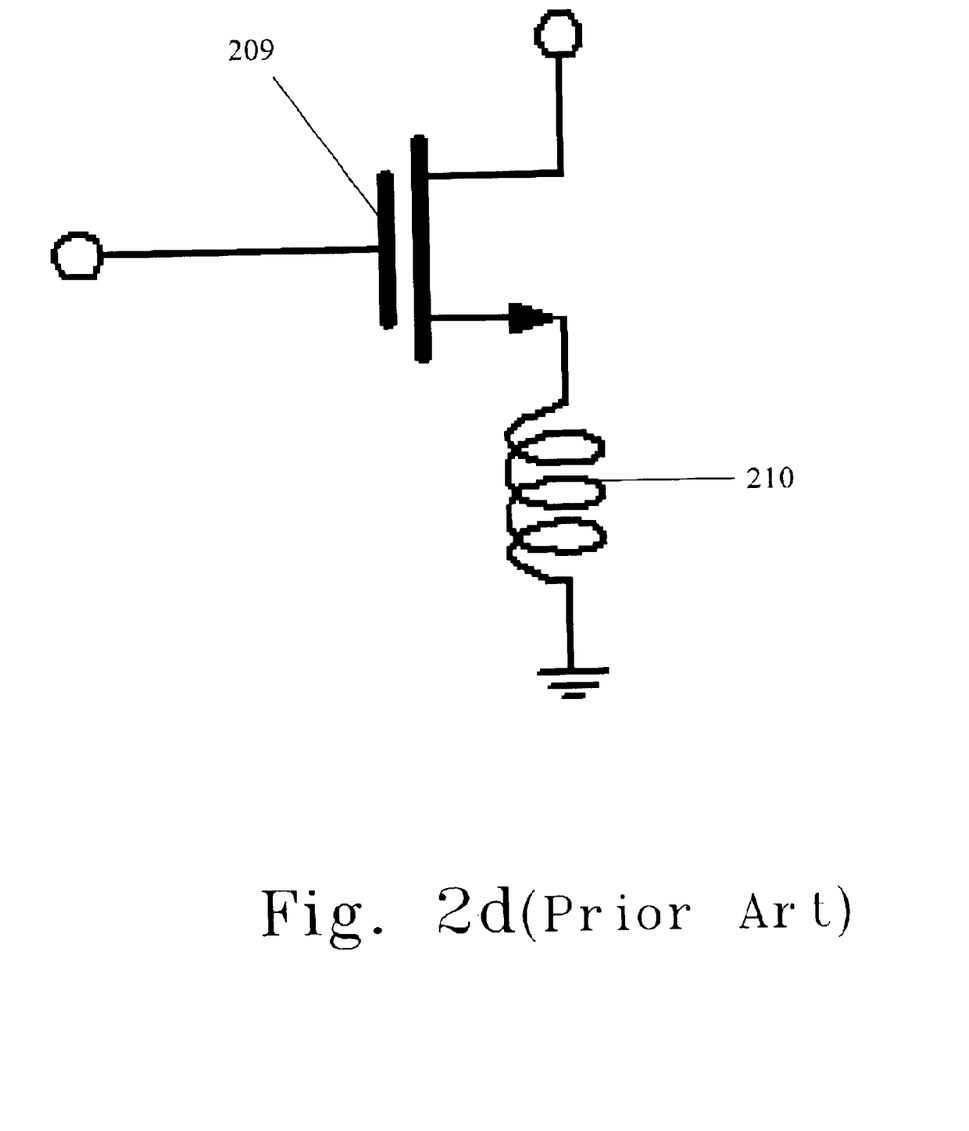

There are mainly 4 different methods proposed in the prior arts regarding the generation of a 50 ohm input impedance of the amplifier. Please refer to FIG. 2(a). In general, the input impedance of a field effect/bipolar transistor 200 is quite high, therefore, the simplest way of generating a 50 ohm input impedance at the input terminal of an amplifier is to connect in parallel a resistor 201 of 50 ohm at the input terminal of the field effect/bipolar transistor 200 to fulfill the requirement of the input impedance matching. Since the resistor 201 is directly and electrically connected to the input terminal of the amplifier, the noises producing by the resistor 201 will result in the direct interferences to the input signals. According to the calculation, the noise figures of the amplifier could be as high as 3 dB, which won't meet the practical requirements, even though the noises produced by the transistor 201 are not counted yet. Besides, the resistor 201 electrically connected in parallel with the input terminal of the amplifier will consume about half of the input power, therefore, this configuration is seldom employed. In FIG. 2(b), it shows the circuit using resistive feedback technique to change the input impedance of an amplifier into 50 ohm. The circuit includes a transistor 202 and resistors 203 to 206. This method is mainly focused on the adjustments of resistors 204 and 205 to produce the input impedance at the input terminal of the amplifier. The noise figure of the amplifier manufactured by this method is lower than the previous method, but the DC power consumption of this configuration is quite large. Referring to FIG. 2(c), it shows the circuit with a common-gate/common-base configuration. The proposed circuit includes a transistor 207 and a resistor 208 to achieve an input impedance of the amplifier of 50 ohm. The main idea of this method is to adjust the transconductance of the transistor 207, gm, and to let gm=20 mS, which will make the input impedance equals to 50 ohm. But through real test, the noises of such a circuit are quite high, and the transconductance of the transistor is also restricted. The last and the most popular circuit for producing an input impedance of 50 ohm of an amplifier is shown in FIG. 2(d). The circuit includes a transistor 209 and an inductor 210 having a terminal connected in series with the source/emitter of the transistor 209. An ideal inductor won't produce any extra noise. Therefore, the lowest noise figure of this configuration will be the same as the transistor 209. In fact, most of the amplifiers with low-noise signals use this kind of configurations. But the inductor 210 will occupy a lot of space on the chip and the quality factor of the inductor on the chip is not high enough, thus a method which could produce a 50 ohm input impedance of the amplifier without using an inductor is really in need.

Keep the drawbacks of the prior arts in mind, and employ experiments and research full-heartily and persistently, the designing methods and circuits for impedance matching are finally conceived by the applicant.

SUMMARY OF THE INVENTION

It is therefore an object of the present invention to provide the designing methods for an impedance matching by using a capacitor to generate the desired resistance.

It is therefore another object of the present invention to provide the electronic circuits for an impedance matching by using a capacitor to generate the desired resistance.

According to the aspect of the present invention, the designing method for an impedance matching includes steps of: connecting in parallel a capacitor to a collector of a bipolar transistor having a common-emitter configuration, and obtaining a desired resistance at a base of the bipolar transistor due to a feedback effect for achieving the impedance matching.

Preferably, the desired resistance is 50 ohm.

According to another aspect of the present invention, the designing method for an impedance matching includes steps of: connecting in parallel a capacitor at a drain of a field effect transistor having a common-source configuration, and obtaining a desired resistance at a gate of the field effect transistor due to a feedback effect for achieving the impedance matching.

Preferably, the desired resistance is 50 ohm.

According to another aspect of the present invention, an electronic circuit for an impedance matching includes: a first bipolar transistor having an emitter electrically connected to a ground, an inductor electrically connected to the base of the first bipolar transistor, a first resistor having one end electrically connected to a collector of the first bipolar transistor, a power supply electrically connected to the other end of the first resistor, a capacitor having one end electrically connected to the collector of the first bipolar transistor, a second bipolar transistor having an emitter electrically connected to the ground and a base electrically connected to the other end of the capacitor, a second resistor having one end electrically connected to the collector of the second bipolar transistor and the other end electrically connected to the power supply, and a third resistor electrically connected between the base and the collector of the second bipolar transistor, wherein a desired resistance is produced in the input impedance looking into the base of the first bipolar transistor through an equivalent parallel combination of an capacitor and an resistor produced at the base of the second bipolar transistor so as to achieve the impedance matching.

Preferably, the desired resistance is 50 ohm.

According to another aspect of the present invention, an electronic circuit for an impedance matching includes: a first field effect transistor having a source electrically connected to a ground, an inductor electrically connected to the gate of the first field effect transistor, a first resistor having a one end electrically connected to a drain of the first field effect transistor, a power supply electrically connected to the other end of the first resistor, a capacitor having one end electrically connected to the drain of the first field effect transistor, a second field effect transistor having a source electrically connected to the ground and a gate electrically connected to the other end of the capacitor, a second resistor having one end electrically connected to the drain of the second field effect transistor and the other end electrically connected to the power supply, and a third resistor electrically connected between the gate and the drain of the second field effect transistor, wherein a desired resistance is produced in the input impedance looking into the gate of the first field effect transistor through an equivalent parallel combination of an capacitor and an resistor produced at the gate of the second field transistor so as to achieve the impedance matching.

Preferably, the desired resistance is 50 ohm.

The present invention may best be understood through the following descriptions with reference to the accompanying drawings, in which:

DETAILED DESCRIPTION OF THE PREFERRED EMBODIMENT

Figure 3A:
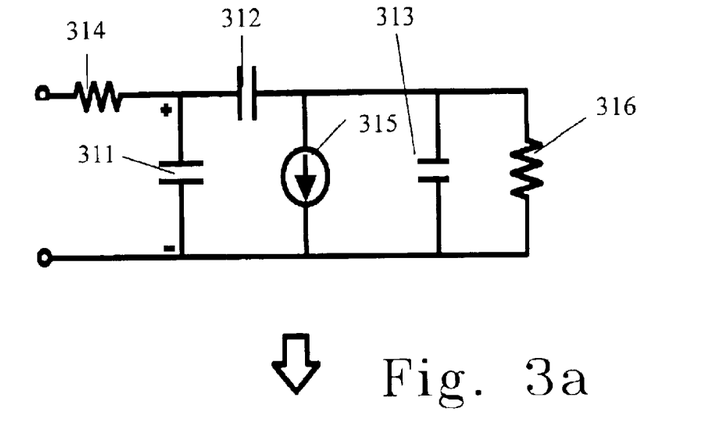
FIGS. 3(a) to 3(c) are the schematic circuit diagrams showing the method of producing an input impedance of 50 ohm by connecting a capacitor and a resistor at the output terminal of a transistor proposed in the present invention.
Figure 3B:
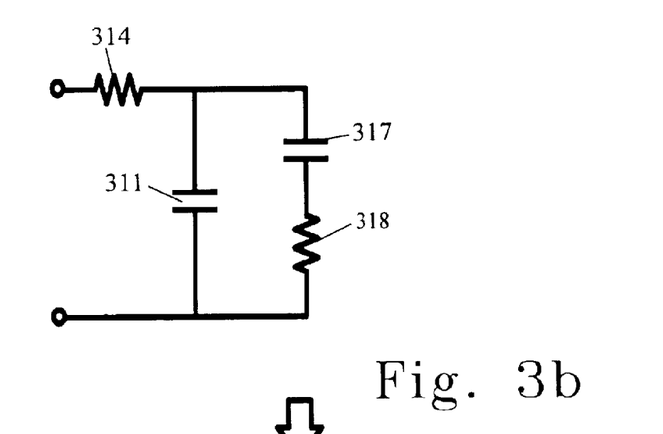
Figure 3C:
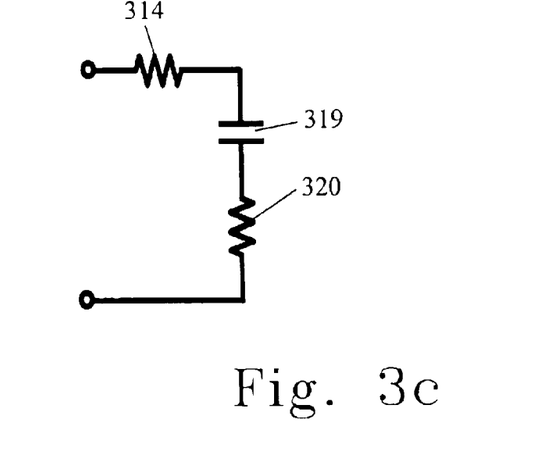

In order not to use an inductor to achieve impedance matching, both a capacitor electrically connected to the output terminal (collector) of a bipolar junction transistor/heterojunction bipolar transistor and a capacitor electrically connected to the output terminal (drain) of a field effect transistor are proposed so as to produce a resistance needed by an impedance matching (50 ohm usually) at the input terminal of a transistor (the base of the bipolar junction transistor/heterojunction bipolar transistor or the gate of the field effect transistor respectively). Please refer to FIGS. 3(a) to 3(c), in which the theorem of the present invention is explained. FIG. 3 shows the small signal equivalent circuit model of the bipolar transistor with a common-emitter configuration. In FIG. 3(a), the circuit includes capacitors: 311, 312, and 313, resistor 314, controllable current source 315, and resistor 316. In FIG. 3(b), the circuit includes capacitor 311, resistor 314, capacitor 317, and resistor 318. In FIG. 3(c), the circuit includes resistor 314, capacitor 319, and resistor 320. The capacitor 313 (refer to as $C_L$) and the resistor 316 (refer to as $R_L$) are electrically connected to the collector of a bipolar transistor in parallel. The small signal equivalent circuit model of the bipolar transistor includes the base resistor 314 (refer to as $R_B$), the capacitor between base and emitter 311 (refer to as $C_{BE}$), the capacitor between base and collector 312 (refer to as $C_{BC}$), and the controllable current source between collector and emitter 315. The controllable current source between collector and emitter 315 is under the control of the voltage between base and emitter $V_{BE}$, and the ratio of the controllable current to the voltage between base and emitter $V_{BE}$ is called transconductance (refer to as gm). The capacitor 313 and resistor 316 could be either simply a capacitor and a resistor, or a capacitor and a resistor from a circuit of the next stage. The capacitance of 313 and the resistance of 316 further include the capacitance and the resistance between the collector and the emitter of the transistor. It can be proved that the parallel combination of the capacitor 313 (refer to as $C_L$), the resistor 316 (refer to as $R_L$), and the controllable current source 315 in series with the capacitor between base and collector 312 is equivalent to the circuit of a capacitor 317 (refer to as $C_M$) and a resistor 318 (refer to as $R_M$) connected in series as shown in FIG. 3(b). The $C_M$ and $R_M$ are decided by the following equations:

$$C_M = C_{BC}(1 + g_m R_L) \tag{1}$$

$$R_M = \frac{R_L}{1 + g_m R_L} + \frac{g_m R_L^2}{(1 + g_m R_L)^2} \frac{C_L}{C_{BC}}. \tag{2}$$

It can be proved furthermore, that the series combination of a capacitor 317 (refer to as $C_M$) and a resistor 318 (refer to as $R_M$) in parallel with the capacitor between base and emitter 311 (refer to as $C_{BE}$) is equivalent to a circuit of a capacitor 319 (refer to as $C_{in}$) and a resistor (refer to as $R'_M$) connected in series for some frequency range as shown in FIG. 3(c). The $C_{in}$ and $R'_M$ are decided by the following equations:

$$C_{in} = C_{BE} + C_M \tag{3}$$

$$R'_M = R_M \left( \frac{C_M}{C_{BE} + C_M} \right)^2 \tag{4}$$

Knowing from equations (2) and (4), the sum of resistances of resistor 320 (refer to as $R'_M$) and base resistor 314 (refer to as $R_B$) would be equal to the desired resistance (50 ohm usually) by adjusting the values of capacitor 313 (refer to as $C_L$), the transconductance of controllable current source between collector and emitter 315, resistor 316 (refer to as $R_L$), and capacitor 312 (refer to as $C_{BC}$). The capacitor 319 (refer to as $C_{in}$) could be resonated at a desired frequency through an inductor electrically connected to it in series so as to accomplish an impedance matching. Though the bipolar transistor is used as an example in the above description, the field effect transistor can be employed too.

Compared to the prior art, the present invention has the following advantages: the proposed configuration does not need an inductor to produce a desired resistance, though a capacitor is needed in the proposed configuration but the space occupied by a capacitor is relatively small, and no extra noise is produced by the proposed configuration, and the proposed configuration can be integrated on a single chip.

Figure 4:
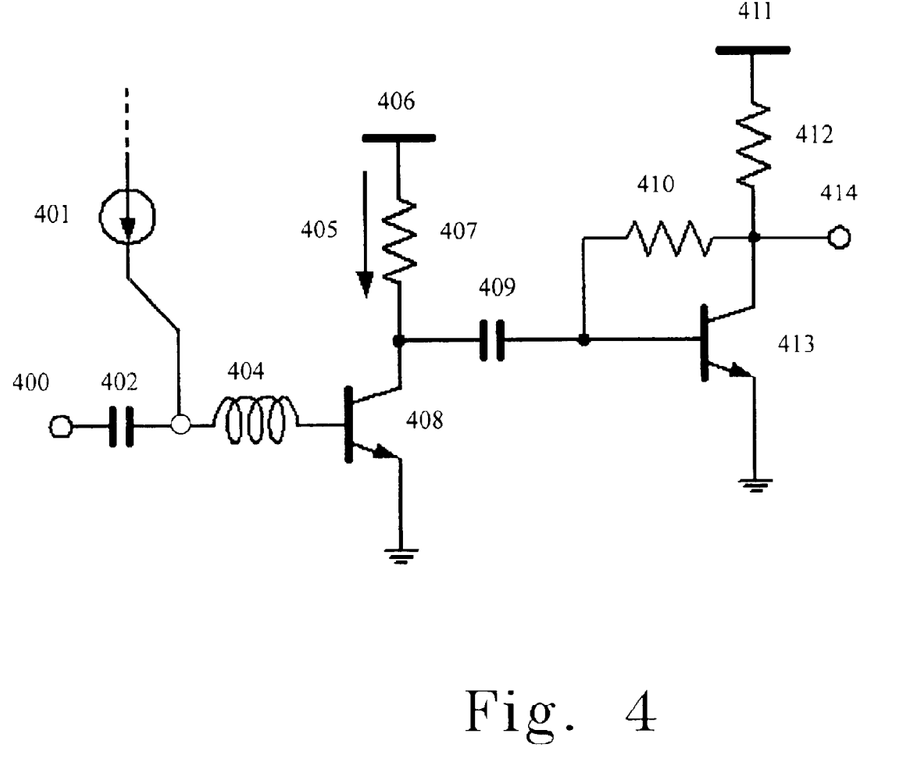
FIG. 4 is the schematic circuit diagram of a 5.2/5.7 GHz low-noise amplifier according to the most preferred embodiment of the present invention.

Please refer to FIG. 4, it shows the schematic circuit diagram of a 5.2/5.7 GHz low-noise amplifier according to the most preferred embodiment of the present invention. The circuit includes an input terminal 400, a bias current source 401, a DC block capacitor 402, an inductor 404, a first power supply 406, a first resistor 407 (with a collector current 405), a first transistor 408, a DC isolation/AC coupling capacitor 409, a second power supply 411, a second resistor 412, a third resistor 410, a second transistor 413, and an output terminal 414. In FIG. 4, the first bipolar transistor 408 has an emitter electrically connected to a ground, the inductor 404 is electrically connected to the base of the first bipolar transistor 408, the first resistor 407 has one end electrically connected to the collector of the first bipolar transistor 408, the first power supply 406 is electrically connected to the other end of the first resistor 407, the capacitor 409 has one end electrically connected to the collector of the first bipolar transistor 408, the second bipolar transistor 413 has the emitter electrically connected to the ground and the base electrically connected to the other end of the capacitor 409, the second resistor 412 has one end electrically connected to the collector of the second bipolar transistor 413 and the other end electrically connected to the second power supply 411, and the third resistor 410 is electrically connected between the base and the collector of the second bipolar transistor 413, wherein a desired resistance is produced in the input impedance looking into the base of the first bipolar transistor 408 through an equivalent parallel combination of an capacitor and an resistor produced at the base of the second bipolar transistor 413 so as to achieve the impedance matching. Though the bipolar transistors are used in the proposed electronic circuit for an impedance matching as described above, the field effect transistors can be employed also. In the most preferred embodiment of the present invention as shown in FIG. 4, both the first resistor 407 and the second resistor 412 have a resistance of 300 ohm, the third resistor 410 has a resistance of 600 ohm, the DC isolation/AC coupling capacitor 409 has a capacitance of 3 pF, and the square measures of emitters of the first transistor 408 and the second transistor 413 are both 12.18 $\mu m^2$. The TSMC 0.35 $\mu m$ SiGE BiCMOS manufacturing procedures are employed. In the most preferred embodiment of the present invention, the input impedance of the second transistor 413 is equivalent to the combination of a capacitor and a resistor connected in parallel, which offer the desired $C_L$ and $R_L$ in the present invention as described above. Through adjusting the parameters of the elements and the bias current (for a proper transconductance) of the proposed circuit as shown in FIG. 4, the input impedance of the first transistor 408 will produce the desired resistance of 50 ohm. The inductor 404, which is electrically connected to the base of the first transistor 408, will offer the desired inductance for achieving the input impedance matching. As for the output terminal 414, the feedback resistor 410 is used to achieve the output impedance matching. When the output impedance matching is not needed (e.g., in cases of zero-IF and low-IF receivers), the feedback resistor 410 is not employed to achieve the output impedance matching. The first resistor 407 and the second resistor 412 are the loads of the first transistor 408 and the second transistor 413 respectively. The voltage values of power supplies 406 and 411 are both 2 volts. Since only one inductor 404 is employed, and the inductor 404 is manufactured on a chip, thus not only the whole proposed circuit can be manufactured on a chip but also the area of the proposed circuit is relatively small. These are the advantages to facilitate the mass production of the proposed circuits.

Figure 5:
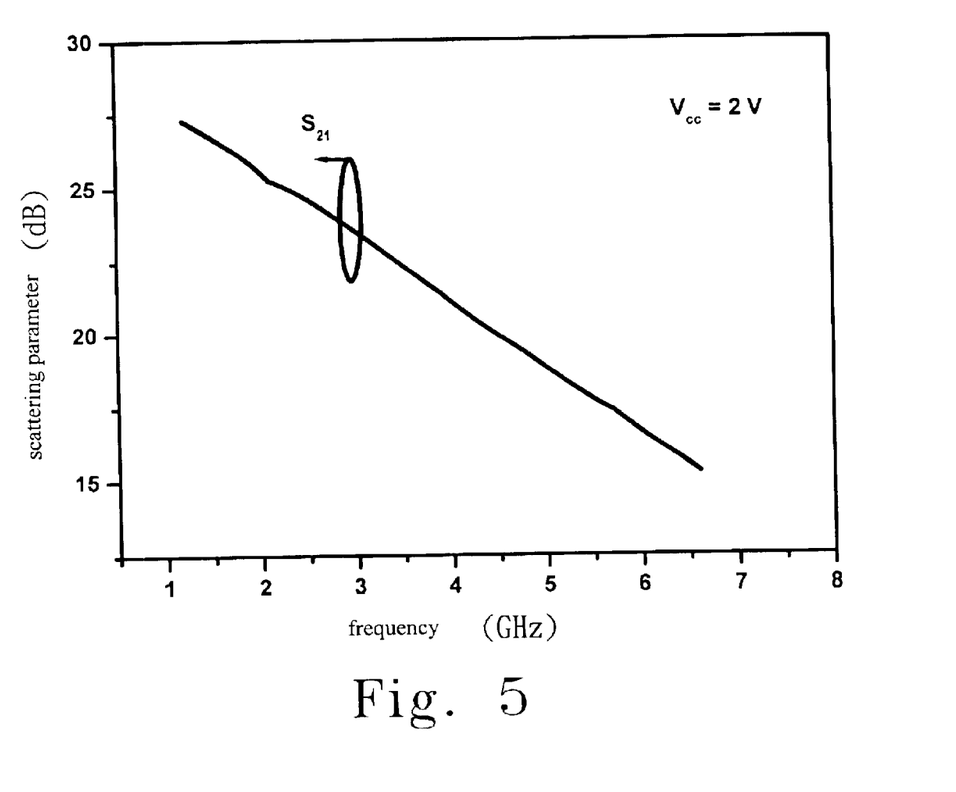
FIG. 5 illustrates the characteristic of power gain versus frequency of a 5.2/5.7 GHz low-noise amplifier according to the most preferred embodiment of the present invention.
Figure 6:
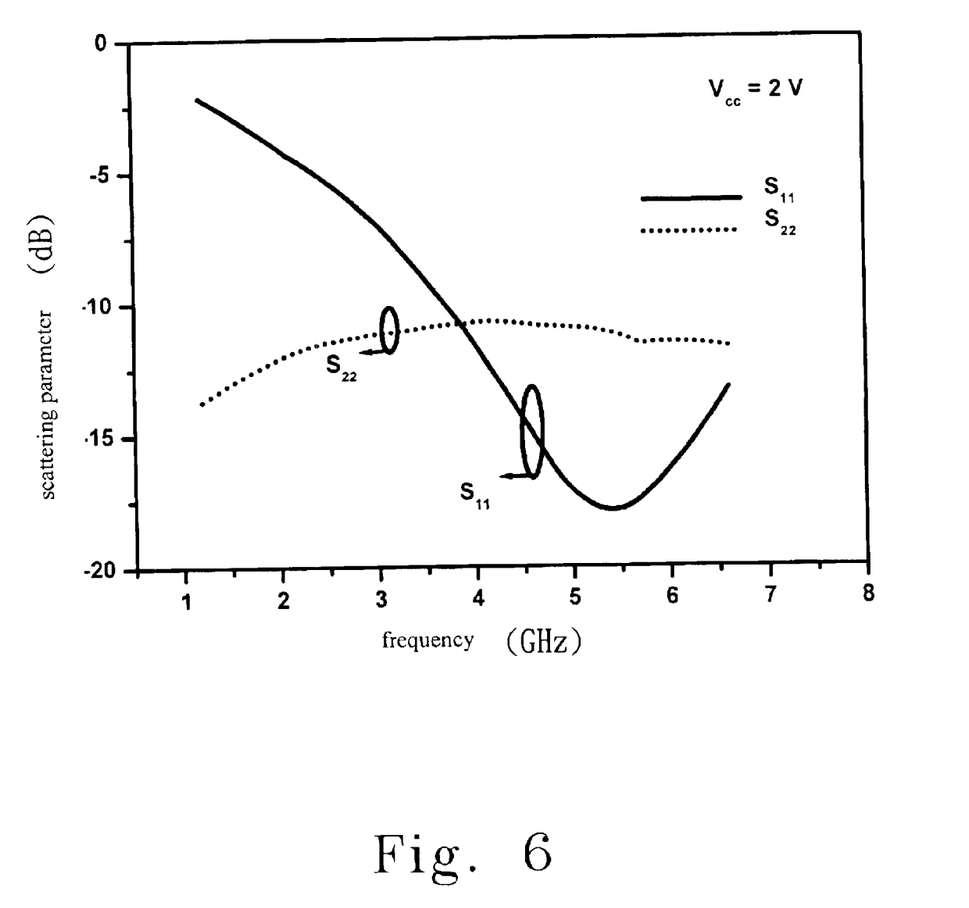
FIG. 6 illustrates the characteristic of input/output return loss versus frequency of a 5.2/5.7 GHz low-noise amplifier according to the most preferred embodiment of the present invention.

As for the gains and the performances regarding this kind of low-noise amplifiers, please refer to FIGS. 5 and 6. From the results of the experiments, the gains (scattering parameter $S_{21}$) of the provided low-noise amplifier at 5.2/5.7 GHz are 18.4 dB and 17.4 dB respectively (See FIG. 5). As for how good the input impedance matching of the proposed low-noise amplifier is, it is usually indicated by input return loss, $S_{11}$, which is one of the scattering parameters. Referring to FIG. 6, the values of $S_{11}$, are lower than −17 dB (the lower the better) between 5.15 GHz and 5.35 GHz, and are lower than −16 dB (the lower the better) between 5.725 GHz and 5.825 GHz, which are quite good. Regarding how good the output impedance matching of this low-noise amplifier is, it is usually indicated by output return loss, $S_{22}$, which is also one of the scattering parameters. In FIG. 6, the values of $S_{22}$ are lower than −10 dB (the lower the better), which are fairly good too. The output impedance matching (measured by $S_{22}$) is important in the cases of the superheterodyne receivers. As for the applications of direct conversion/zero-IF/Low IF receivers, the issue of output impedance matching is not so important.

Figure 7:
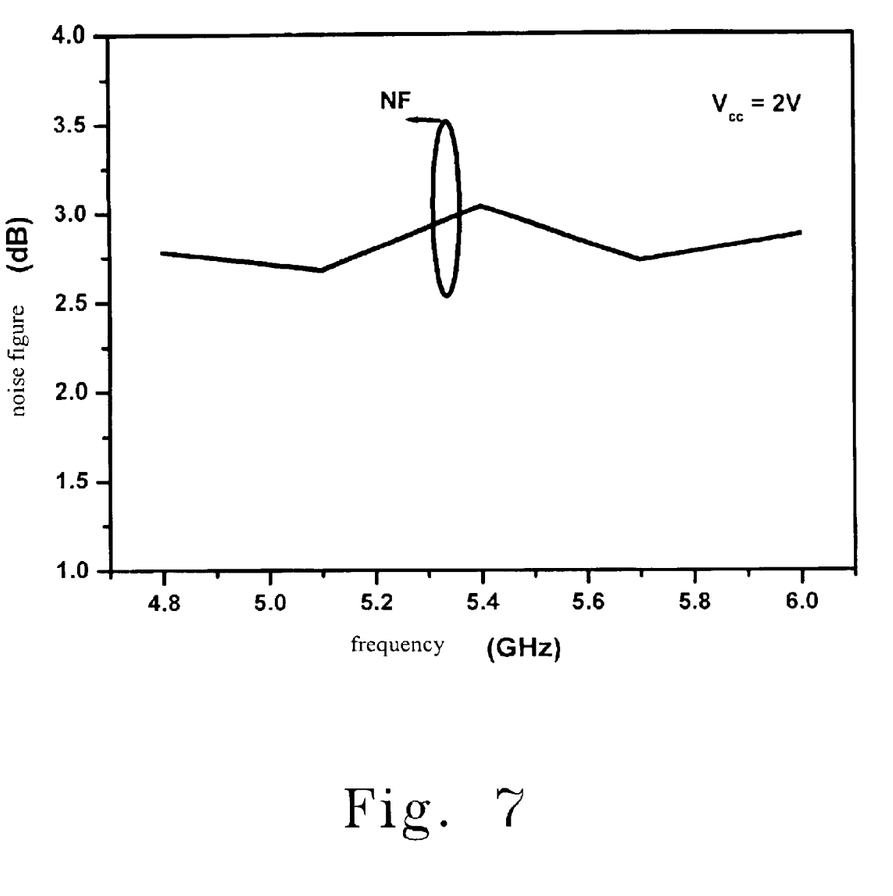
FIG. 7 illustrates the characteristic of noise figure versus frequency of a 5.2/5.7 GHz low-noise amplifier according to the most preferred embodiment of the present invention.

As for the performances of this kind of low-noise amplifiers regarding the noise figures, please refer to FIG. 7. The noise figures are 2.79 dB and 2.73 dB at the frequencies of 5.2/5.7 GHz respectively. To the knowledge of the applicants, these are the best known-figures of the fully integrated bipolar junction transistor low-noise amplifiers in the world. For the applications of the 802.11a Wireless Local Area Network (WLAN), the noise figures of the low-noise amplifiers should be lower than 5 dB, the input/output loss return should be lower than −10 dB, and the gains should be larger than 10 dB. Therefore, the most preferred embodiment of the present invention, the 5.2/5.7 GHz low-noise amplifier, has very good results regarding gains, noise figures, and the performances of impedance matching both in the bands of 5.2 GHz and 5.7 GHz.

In the present invention, the capacitance of a capacitor, which won't increase the noise figures of an amplifier and won't occupy much of the space, is employed to produce the resistance required by the input impedance matching. Therefore, the designing methods and circuits proposed in the present invention for the impedance matching are more innovative and progressive than the prior arts.

Although the invention has been shown and described in terms of specific embodiments, it will be evident that changes and modifications are possible which do not in fact depart from the inventive concepts taught herein. It will be appreciated by those skilled in the art that various omissions, additions and modifications may be made to the processes described above without departing from the scope of the invention, and all such modifications and change are intended to fall within the scope of the invention, as defined in appended claims.

What is claimed is:

1. A designing method for an impedance matching, comprising steps of:

connecting in parallel a capacitor to a collector of a bipolar transistor having a common-emitter configuration; and obtaining a desired resistance at a base of said bipolar transistor due to a feedback effect for achieving said impedance matching.

2. The designing method according to claim 1, wherein said desired resistance is 50 ohm.

3. A designing method for an impedance matching, comprising steps of:

connecting in parallel a capacitor to a drain of a field effect transistor having a common-source configuration; and obtaining a desired resistance at a gate of said field effect transistor due to a feedback effect for achieving said impedance matching.

4. The designing method according to claim 3, wherein said desired resistance is 50 ohm.

5. An electronic circuit for an impedance matching, comprising:

a first bipolar transistor having an emitter electrically connected to the ground;

an inductor electrically connected to the base of said first bipolar transistor;

a first resistor having one end electrically connected to the collector of said first bipolar transistor;

a first power supply electrically connected to the other end of said first resistor;

a capacitor having one end electrically connected to said collector of said first bipolar transistor;

a second bipolar transistor having an emitter electrically connected to said ground and a base electrically connected to the other end of said capacitor;

a second resistor having one end electrically connected to the collector of said second bipolar transistor;

a second power supply electrically connected to the other end of said second resistor; and a third resistor electrically connected between said base and said collector of said second bipolar transistor, wherein a desired resistance is produced in the input impedance looking into the said base of said first bipolar transistor through an equivalent parallel combination of an capacitor and an resistor produced at the said base of said second bipolar transistor so as to achieve said impedance matching.

6. The electronic circuit according to claim 5, wherein said desired resistance is 50 ohm.

7. An electronic circuit for an impedance matching, comprising:

a first field effect transistor having a source electrically connected to a ground;

an inductor electrically connected to a gate of said first field effect transistor;

a first resistor having one end electrically connected to the drain of said first field effect transistor;

a first power supply electrically connected to the other end of said first resistor;

a capacitor having one end electrically connected to said drain of said first field effect transistor;

a second field effect transistor having a source electrically connected to said ground and a gate electrically connected to the other end of said capacitor;

a second resistor having one end electrically connected to the drain of said second field effect transistor;

a second power supply electrically connected to the other end of said second resistor; and a third resistor electrically connected between said gate and said drain of said second field effect transistor, wherein a desired resistance is produced in the input impedance looking into the said gate of said first field effect transistor through an equivalent parallel combination of an capacitor and an resistor produced at the said gate of said second field transistor so as to achieve said impedance matching.

8. The electronic circuit according to claim 7, wherein said desired resistance is 50 ohm.

* * * * *